(12) United States Patent  
Kummaraguntla et al.

(10) Patent No.: US 8,428,534 B1
(45) Date of Patent: Apr. 23, 2013

(54) ACCURACY POWER DETECTION UNIT

(75) Inventors: Ravi K. Kummaraguntla, Austin, TX (US); Ruifeng Sun, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 31 days.

(21) Appl. No.: 13/250,340

(22) Filed: Sep. 30, 2011

(51) Int. Cl.
*H04B 7/00* (2006.01)
*H03K 5/22* (2006.01)

(52) U.S. Cl.
USPC .................. 455/232.1; 455/250.1; 327/65

(58) Field of Classification Search ............... 455/127.2, 455/136, 232.1, 240, 250.1; 327/63, 65
See application file for complete search history.

(56) References Cited

U.S. PATENT DOCUMENTS

| | | | |
|---|---|---|---|
| 4,764,892 A | | 8/1988 | Thomas |
| 5,079,454 A | * | 1/1992 | Benton et al. .................. 327/65 |
| 5,656,964 A | | 8/1997 | Liu |
| 5,796,309 A | * | 8/1998 | Nguyen ........................ 330/289 |
| 5,873,029 A | * | 2/1999 | Grondahl et al. ............. 455/126 |
| 6,255,889 B1 | | 7/2001 | Branson |
| 7,504,813 B2 | * | 3/2009 | Manstretta .................... 323/312 |
| 7,676,200 B2 | * | 3/2010 | Carmon et al. ................. 455/91 |
| 7,808,282 B2 | * | 10/2010 | Cheung .......................... 327/63 |
| 8,264,255 B2 | * | 9/2012 | Sun et al. ....................... 327/58 |
| 2001/0033192 A1 | | 10/2001 | Knierim et al. |
| 2006/0222115 A1 | | 10/2006 | Dornbusch et al. |
| 2011/0102047 A1 | | 5/2011 | Sun et al. |

* cited by examiner

*Primary Examiner* — Sonny Trinh

(57) ABSTRACT

Techniques are disclosed relating to radio frequency (RF) power detection. In one embodiment, a power detection unit is disclosed that includes a multiplier circuit configured to receive a first voltage of a voltage differential signal at gates of a first transistor pair and a second voltage of the voltage differential signal at gates of a second transistor pair. The first multiplier is configured to output a current that varies proportionally to a square of a voltage difference between the first and second voltages. In some embodiments, sources of the first transistor pair are coupled to sources of the second transistor pair, and the sources of the second transistor pair are coupled together. In some embodiments, the power detection unit is configured to compensate for mismatched transistors by applying offset voltages to bodies of transistors in the first and second transistor pairs.

20 Claims, 9 Drawing Sheets

ACCURACY POWER DETECTION UNIT

BACKGROUND

1. Technical Field

This disclosure relates generally to processing radio frequency (RF) signals, and, more specifically, to RF power detection.

2. Description of the Related Art

RF circuits typically perform a variety of operations to process a received signal. Such operations may include filtering the signal, demodulating it, sampling it, etc. In order to perform some of these operations, various circuits in the receiver chain may require that the RF signal have a signal strength within a particular range (e.g., a range of 60-80 dB). Often, however, an RF signal is too weak by the time it arrives at the receiver. To account for this, the receiver may attempt to amplify the signal before processing it further.

In many instances, RF circuits employ a feedback loop in which an incoming signal passes through an amplifier and then a power detector, which measures the signal's power. If the signal strength is too high or too low, the RF circuit adjusts the gain of amplifier accordingly. This form of feedback loop is commonly referred to as an automatic gain control (AGC) system.

SUMMARY OF EMBODIMENTS

The present disclosure describes structures and methods for improving the accuracy of multiplier circuits and power detection circuits.

In one embodiment, a power detection unit is disclosed. The power detection unit includes a multiplier circuit configured to receive a first voltage of a voltage differential signal at gates of a first transistor pair and a second voltage of the voltage differential signal at gates of a second transistor pair. The multiplier circuit is configured to output a current that varies proportionally to a square of a voltage difference between the first and second voltages. In such an embodiment, sources of the first transistor pair are coupled to sources of the second transistor pair, and the sources of the second transistor pair are coupled together.

In another embodiment, power detection unit is disclosed. The power detection unit includes a multiplier circuit configured to receive a first voltage of a voltage differential signal at gates of a first transistor pair and a second voltage of the voltage differential signal at gates of a second transistor pair. The multiplier circuit is configured to output a current that varies proportionally to a square of a voltage difference between the first and second voltages. The power detection unit is configured to adjust a threshold voltage of a transistor in the first transistor pair and a threshold voltage of a transistor in the second transistor pair.

In still another embodiment, a method is disclosed. The method includes providing positive and negative voltage differential signals to gates of first and second transistor pairs in a multiplier circuit. The multiplier circuit is configured to output a current that varies proportionally to a square of a voltage difference between the gates of the first transistor pair and the gates of the second transistor pair. The method further includes determining whether the multiplier circuit produces the same current in response to the positive and negative voltage differential signals. The method further includes applying offset voltages to a body of a transistor in the first transistor pair and a body of a transistor in the second transistor pair based on the determining.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

DETAILED DESCRIPTION

The present disclosure describes embodiments of a power detection unit and embodiments of circuitry, which may be included within such a unit. As will be described below, the accuracy of the power detection unit may be affected by various factors, which can reduce performance of the unit. To account for such factors, the power detection unit, in various embodiments, may employ any of variety of techniques such as described below. It is noted that, while certain techniques are described within the context of power detection, such techniques may also be applicable to other applications in some embodiments.

Figure 1:
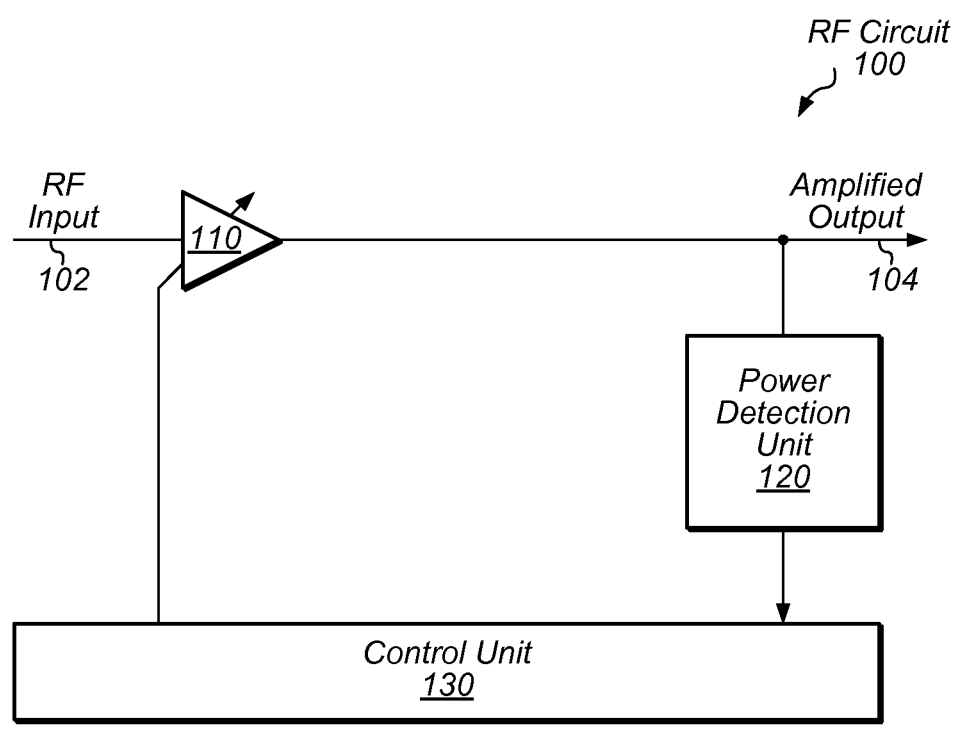
FIG. 1 is a block diagram illustrating one embodiment of an RF circuit configured to amplify a received RF signal based on its power.

Turning now to FIG. 1, a block diagram of an RF circuit 100 is depicted. RF circuit 100 in one embodiment of an automatic gain control (AGC) system that is configured to amplify a received RF input signal 102 based on its strength (i.e., power). As shown, RF circuit 100 includes an adjustable amplifier 110, power detection unit 120, and a control unit 130. RF circuit 100 may be used in various applications such as television receivers, cellular phones, modems, network devices, satellite radios, etc. In some embodiments, RF circuit 100 may be used in wireless devices; in other embodiments, RF circuit 100 may be used in wired devices. In short, RF circuit 100 may be used in any suitable application.

In the illustrated embodiment, RF circuit 100 provides an incoming RF signal 102 to adjustable amplifier 110 to produce an amplified output signal 104. In one embodiment, power detection unit 120 measures the power of signal 104 and indicates the result to control unit 130. Control unit 130 (which may be implement using a microcontroller, in some embodiments) is configured to then adjust the gain of amplifier 110 so that the amplified output signal 104 falls within a desired range for circuit 100. Accordingly, control unit 130 may increase or decrease the gain of amplifier 110 depending on whether signal 104 is too strong or too weak, respectively.

In various embodiments, the amplified output signal 104 may then be provided to additional circuitry (not shown) in a receiver chain for further processing.

In many instances, the accuracy of power detection unit 120 is important for ensuring that signal 102 is amplified appropriately. If power detection unit 120 were to have a large offset error, amplifier 110 might over amplify signal 102 causing saturation problems or under amplify signal 102 making it too weak to process. As will be described next in conjunction with FIG. 2, in various embodiments, power detection unit 120 may measure the power of signal 104 by using one or more multiplier circuits that are configured to perform a squaring operation (since the power of a signal varies proportional to the square of the signal's voltage as defined by the combination of Joule's law and Ohm's law). In many instances, the accuracy of power detection unit 120 is dependent on the accuracy of its multipliers. In various embodiments described below, power detection unit 120 may employ various techniques to improve their accuracy.

Figure 2:
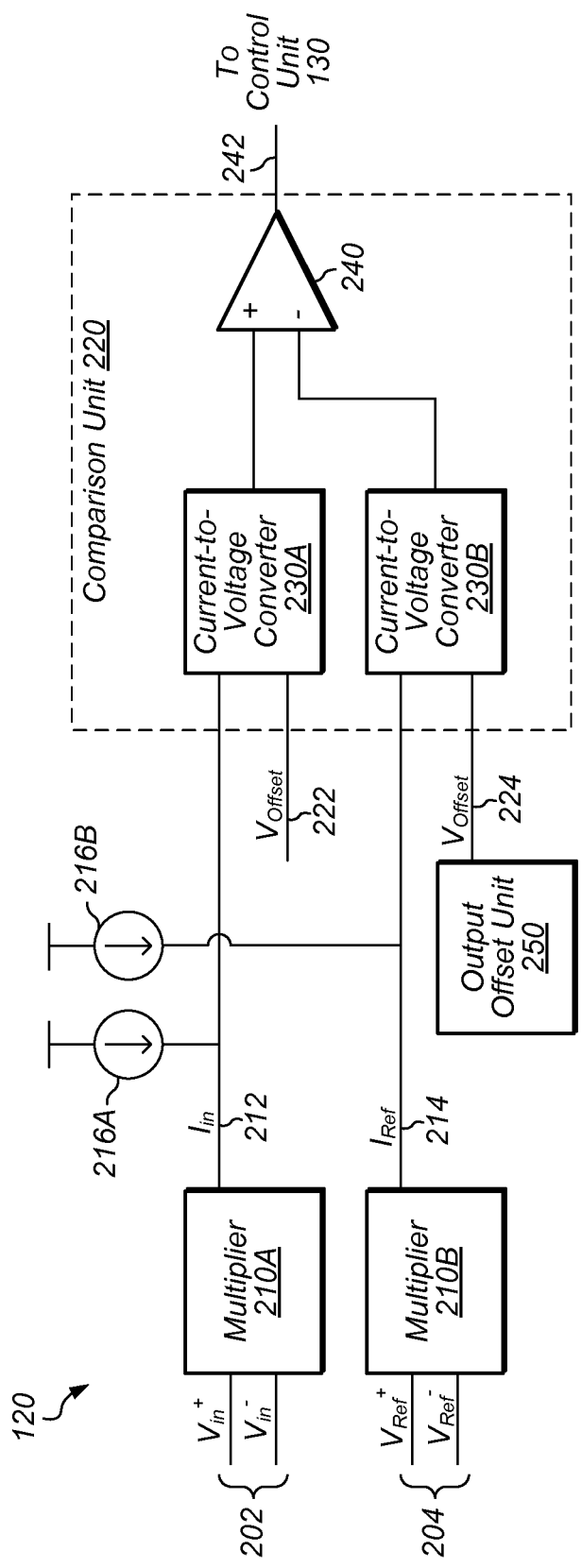
FIG. 2 is a block diagram illustrating one embodiment of a power detection unit within the RF circuit.

Turning now to FIG. 2, one embodiment of power detection unit 120 is depicted. In the illustrated embodiment, power detection unit 120 includes multipliers 210A and 210B, current sources 216A and 216B, a comparison unit 220, and an output offset unit 250. In some embodiments, power detection unit 120 may include additional multipliers 210, current sources 216, comparison units 220, and/or output offset units 250.

Multiplier 210A, in one embodiment, is configured to square the voltage of a signal (such as RF signal 104, in one embodiment) to determine its power. In the illustrated embodiment, multiplier 210A receives the signal as a voltage differential signal 202 (a signal represented by the difference between voltages $V_{in}^+$ and $V_{in}^-$), and produces a corresponding current signal $I_{in}$ 212 that varies proportionally to the square of the voltage of signal 202 such that $I_{in} \approx (V_{in}^+ - V_{in}^-)^2$. An example illustrating this relationship is described in further detail below in conjunction with FIG. 4.

Multiplier 210B, in one embodiment, is configured to generate a reference signal for comparison with the signal produced by multiplier 210A. In the illustrated embodiment, multiplier 210B receives a voltage reference signal as a differential voltage signal 204 (again, the signal represented by the difference between voltages $V_{Ref}^+$ and $V_{Ref}^-$) and produces a corresponding reference current signal $I_{Ref}$ 214 that varies proportionally to the square of the voltage of signal 204 such that $I_{Ref} \approx (V_{Ref}^+ - V_{Ref}^-)^2$.

In the illustrated embodiment, current sources 216 are used to shift the respective input signal independent DC currents 212 and 214 to prepare them for comparison within comparison unit 220.

Comparison unit 220, in one embodiment, is configured to compare signals 212 and 214 and to generate a corresponding output signal 242 (i.e., a comparison indication) for control unit 130. In the illustrated embodiment, signals 212 and 214 pass through respective current-to-voltage converters 230A and 230B to produce voltages comparable by voltage comparator 240 (in other embodiments, a current comparator may be used instead). In various embodiments, converters 230 produce voltages based on initial respective offset voltages (shown as $V_{Offset}$ 222 and $V_{Offset}$ 224; as will be described below, these reference voltages may be adjusted (e.g., using output offset unit 250) to compensate for when multipliers 210 produce different currents for the same input). After converters 230 have produced corresponding voltages, comparator 240 compares the voltages and generates a corresponding output signal 242 for control unit 130. Accordingly, in one embodiment, comparator 240 may output a voltage representative of a logical one for signal 242 if the voltage produced from current 212 is greater than the voltage produced from current 214, and a logical zero for signal 242 otherwise.

In some instances, multipliers 210 may produce a less than ideal square function, which can affect the accuracy of power detection unit 120. For example, a multiplier 210 may produce a square function that has additional factors, which introduce non-linearity into the output current such as $V^3$, $V^4$, and $V^5$ factors. A multiplier 210 may also produce a square that is asymmetric (such as described in conjunction with FIG. 4). Both of these problems may be caused by mismatches of transistors (e.g., caused by impurities in the silicon, variances in the manufacturing of the multipliers 210, etc.), problems with the circuitry that provides the input signals 202 and 204 for multipliers 210, etc. In various embodiments, multipliers 210 may include circuitry (or be coupled to circuitry) that is configured to correct the square function (i.e., make it closer to ideal) such as described below in conjunction with FIGS. 2-6.

Another problem is that multipliers 210 may produce near-ideal square functions, but produce slightly different currents given the same input signal, which also affects the accuracy of power detection unit 120. In the illustrated embodiment, output offset unit 250 is configured to change voltage 224 to cause converter 230B change the DC offset of the voltage provided to comparator 240 (and, thus, the output offset of multiplier 210B) in order to compensate for the difference in output currents. Output offset unit 250 is described in further detail below in conjunction with FIGS. 7 and 8.

Figure 3A:
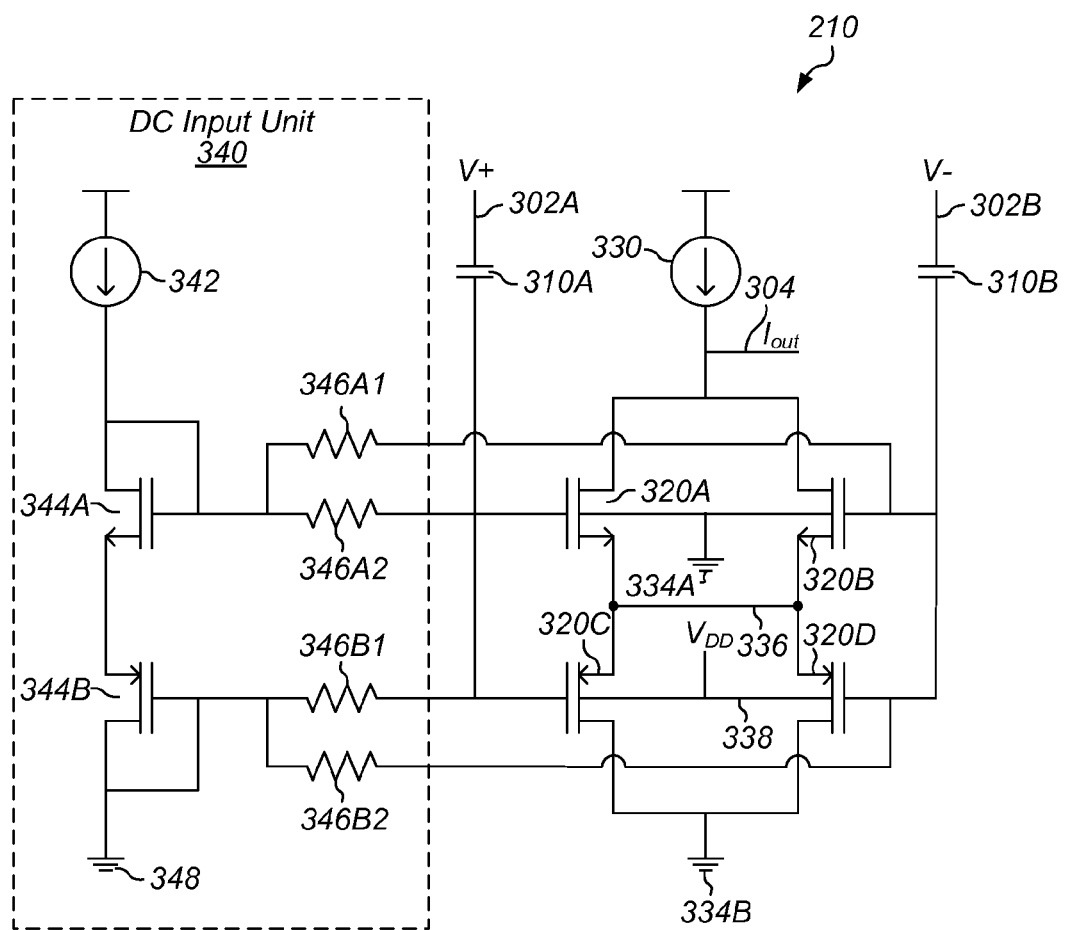
FIGS. 3A and 3B are block diagrams illustrating embodiments of a multiplier circuit within the power detection unit.

Turning now to FIG. 3A, one embodiment of a multiplier 210 is depicted. In the illustrated embodiment, multiplier 210 includes capacitors 310A and 310B, transistors 320A-D, current source 330, and DC input unit 340, which, in turn, includes current source 342, transistors 344A and 344B, resistors 346A1-B2, and a ground reference 348. As shown, capacitor 310A is coupled to the gates of transistors 320A and 320C, which form a first transistor pair. Capacitor 310B is coupled to the gates of transistors 320B and 320D, which form a second transistor pair. The drains and bodies of transistors 320A and 320B, in turn, are coupled respectively to current source 330 and ground reference 334A. The sources of transistors 320A and 320B are coupled via line 336 to sources of transistors 320C and 320D. The drains and bodies of transistors 320C and 320D, in turn, are respectively coupled to ground reference 334B and voltage source $V_{DD}$. In one embodiment, transistors 320A and 320B are N-type metal-oxide-semiconductor field-effect transistors (nMOS-FETs) and transistors 320C and 320D P-type MOSFETS (pMOSFETS).

In the illustrated embodiment, multiplier 210 receives voltages 302A and 302B of a voltage differential signal (e.g., signal 202 or signal 204) at capacitors 310A and 310B, which high-pass filter the signal to remove its DC component and leave only its AC component when it arrives at the gates of transistors 320. The DC component at the gates of transistors 320 is supplied by DC input unit 340. These DC and AC components change the gate-to-source voltages of transistors 320 causing them to source (i.e., pull) current from current source 330. The remaining current from current source 330, which does not pass through transistors 320, becomes the output current 304 of multiplier circuit 210 shown as $I_{out}$. As discussed above, multiplier 210 is configured to vary the current $I_{out}$ proportionally to the square of the voltage difference between voltages 302A and 302B.

In some instances, transistors 320A and 320B may be mismatched relative to transistors 320C and 320D such that a body effect would normally (i.e., without the benefit of line 336) introduce unwanted nonlinearity into $I_{out}$ such as $V^3$, $V^4$, $V^5$ factors. A mismatch may occur, for example, if transistor 320A has a lower threshold voltage than the threshold voltage of transistor 320C. One approach for canceling out this nonlinearity is to couple to the bodies of transistors 320A and 320B to their respective sources, which reduces their body-to-source voltages. A problem with this approach is that it also increases the parasitic capacitances of transistors 320A and 320B, which can reduce RF performance. A better approach is to couple the sources of transistors 320 via line 336 as shown in the illustrated embodiment. In many instances, the insertion of line 336 can reduce the presence of nonlinearity without compromising RF performance.

In some instances, the multiplier 210 may still produce a square function that is asymmetric due to the presence of offsets. These offsets may be introduced by the circuitry providing signals 302, a mismatch of transistors 320A and 320B, a mismatch of transistors 320C and 320D, etc. In some embodiments, multiplier 210 may further include a threshold-voltage calibration unit 350 to compensate for these problems such as described next.

Figure 3B:
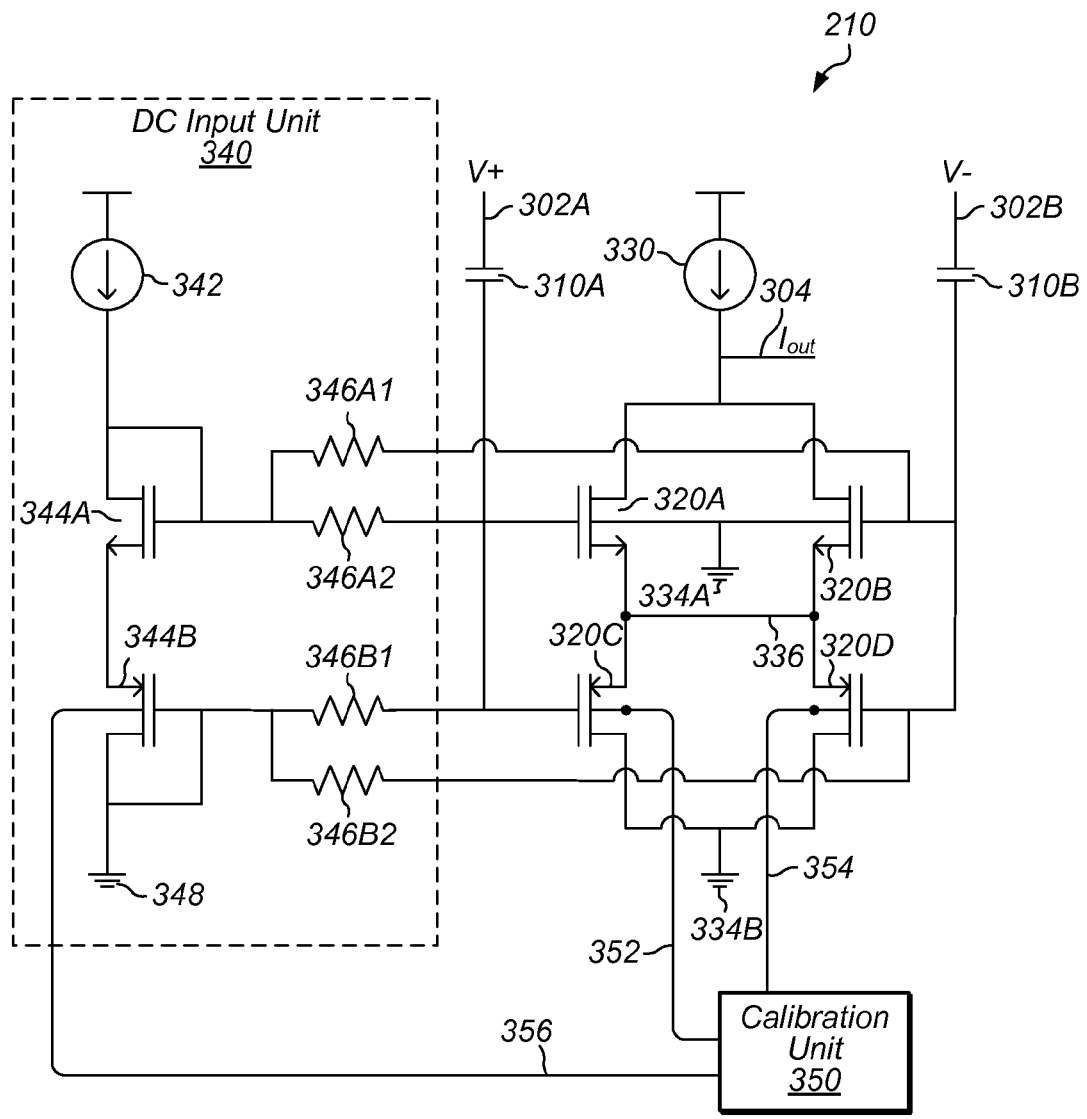

Turning now to FIG. 3B, another embodiment of a multiplier 210 is depicted. In the illustrated embodiment, multiplier 210 includes the same elements 302-348 as shown in FIG. 3A, except that the bodies of transistors 320C and 320D are no longer coupled to a voltage source $V_{DD}$ and, instead, are coupled to a calibration unit 350 via lines 352 and 354. As will be described in conjunction with FIGS. 4-6, in various embodiments, calibration unit 350 is configured to apply offset voltages (i.e., different voltages) to the bodies (i.e., back gates) of transistors 320C and 320D via lines 352 and 354 to change their respective threshold voltages. By changing the threshold voltages, calibration unit 350 is configured to compensate for unwanted DC offsets, which can produce an asymmetric squaring function such as described next with FIG. 4.

Figure 4:
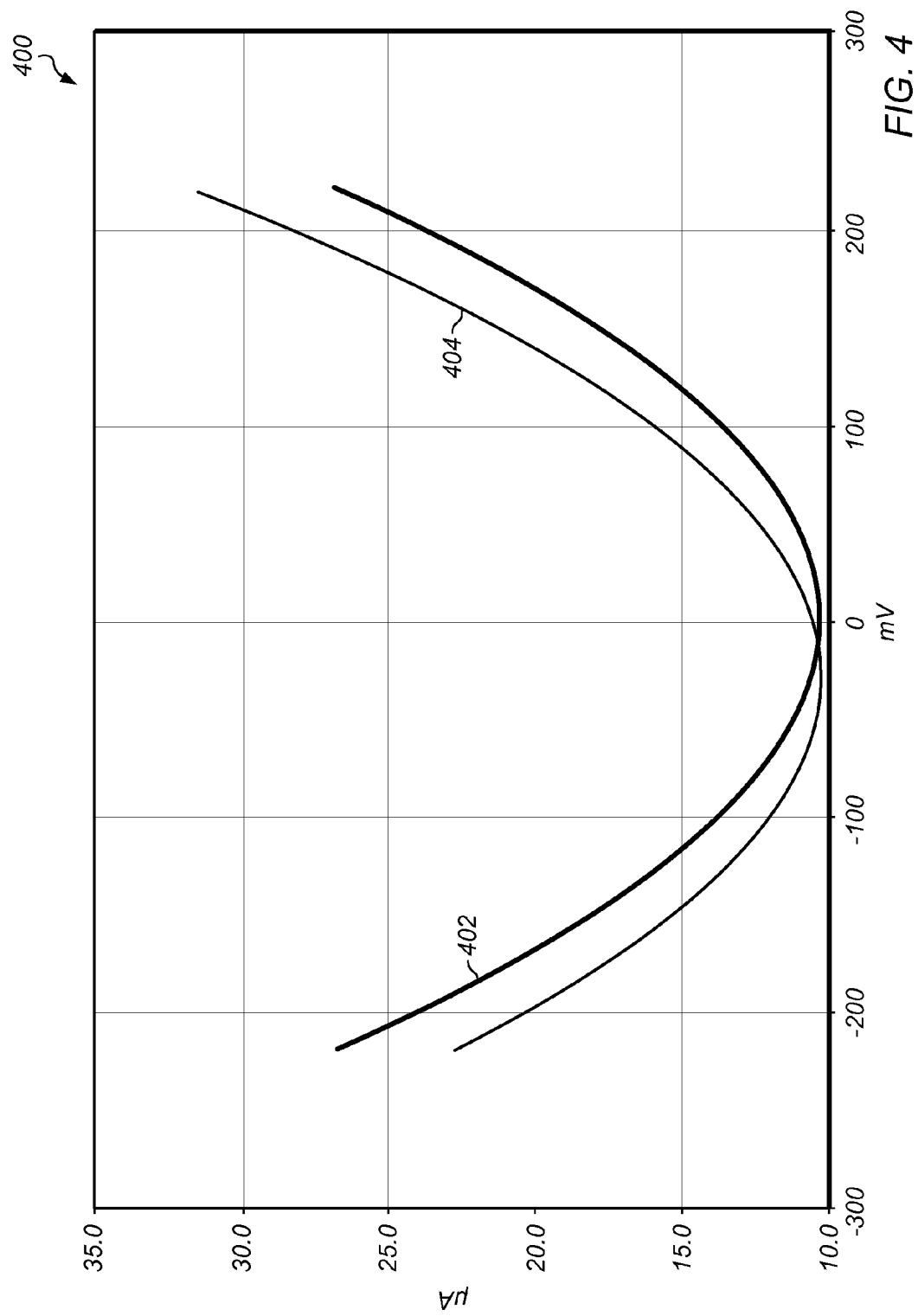
FIG. 4 is a graph illustrating examples of ideal and non-ideal transfer functions of a multiplier circuit.

Turning now to FIG. 4, a graph 400 illustrating to examples of two possible transfer functions 402 and 404 of a multiplier 210 is depicted. As discussed above, multiplier 210 may receive a voltage input (or differential voltage input) shown within the range of −300 mV to 300 mV, in the illustrated embodiment. Multiplier 210 may then produce a corresponding current shown within the range of 10 to 35 µA, in the illustrated embodiment. Since a square function is parabolic function that produces the same output for a given input regardless of its sign, the ideal (i.e., correct) transfer function for a multiplier 210 is a squaring function centered around the 0V origin such as transfer function 402. Transfer function 402 illustrates this as it has the same output current (e.g., 24 µA) regardless of a given input's sign (e.g., −200 mV vs. 200 mV). Unfortunately, multiplier 210 may, in some instances, produce an asymmetric (i.e., non-ideal) squaring function such as transfer function 404. Here, transfer function 404 is shifted by a negative DC offset of 30 mV. As a result, a −200 mV input voltage produces 20 µA current while a 200 mV input voltage produces a 26 µA current. In various embodiments, calibration unit 350 may be configured to detect this shift and apply an appropriate set of offset voltages to compensate for it.

Figure 5:
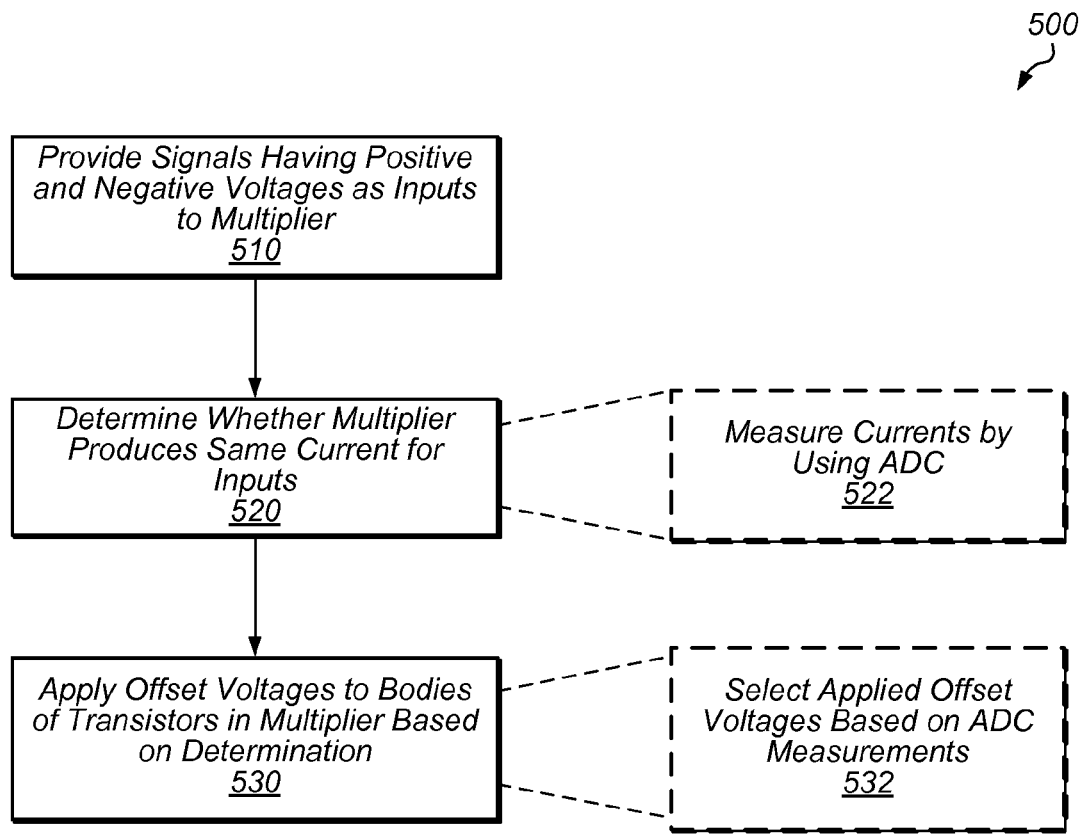
FIG. 5 is a flow diagram illustrating one embodiment of a method for calibrating transistors in a multiplier circuit.

Turning now to FIG. 5, a flow chart of a method 500 for calibrating transistors in a multiplier circuit is depicted. Method 500 is one embodiment of a method that may be performed by a circuit that includes a multiplier circuits such as power detection unit 120 or a circuit that is included within a multiplier circuit such as calibration unit 350. In some embodiments, method 500 may be performed as part of an initial calibration for a circuit (such as during the circuit's startup, during testing of the circuit by automated testing equipment (ATE), etc.). In many instances, performance of method 500 can improve the accuracy of a multiplier circuit.

In step 510, signals having positive and negative voltages (e.g., a differential signal having a voltage of 200 mV and a differential signal having a voltage of −200 mV such as described with FIG. 4) are provided to gates of a multiplier circuit (e.g., as voltages 302 at gates of transistors 320) to cause the multiplier circuit output corresponding currents $I_{out}$.

In step 520, the output currents (e.g., the 20 µA current and the 26 µA current described above) are measured to determine whether the multiplier circuit produces the same current in response to both signals—thus, indicating that the multiplier has an ideal or non-ideal transfer function. In some embodiments, step 520 may include measuring the currents by using an analog-to-digital converter (ADC) as shown in substep 522. In one embodiment, this ADC may be located within calibration unit 350 (e.g., within control unit 670 described below). In other embodiments, this ADC may be located elsewhere within multiplier 210 or RF circuit 100. In other embodiments, step 520 may include usage of an array of comparators to measure the currents.

In step 530, offset voltages are applied (e.g., by a calibration unit 350) to bodies of transistors (e.g., transistors 320C and 320D) of the multiplier based on the determination in step 520. In some embodiments, the amount of offset voltages may be selected in substep 532 based on the currents measured by an ADC in step 522. For example, greater offset voltages may be selected if the measured currents differ by a significant amount. Alternatively, step 530 may also include not applying offset voltages (in other words, applying the same voltage) if the currents are not different or have negligible differences within permissible tolerances that do not heavily impact the accuracy of the multiplier. For example, in one embodiment, a multiplier 210 is considered to produce an ideal transfer function if the input referred offset voltage for the multiplier is within +/−1 mV of 0V.

As will be described next, in one embodiment, calibration unit 350 may be configured to generate the offset voltages (e.g., during step 530) by passing a current through a resistor ladder that includes a plurality of resistors coupled together in series. Calibration unit 350 may select various ones of the resistors to select a desired offset voltage. In some embodiments, calibration unit 350 is further configured to change the generated offset voltage of a selected resistor by coupling a resistor in parallel with one of the plurality of resistors in the resistor ladder.

Figure 6:
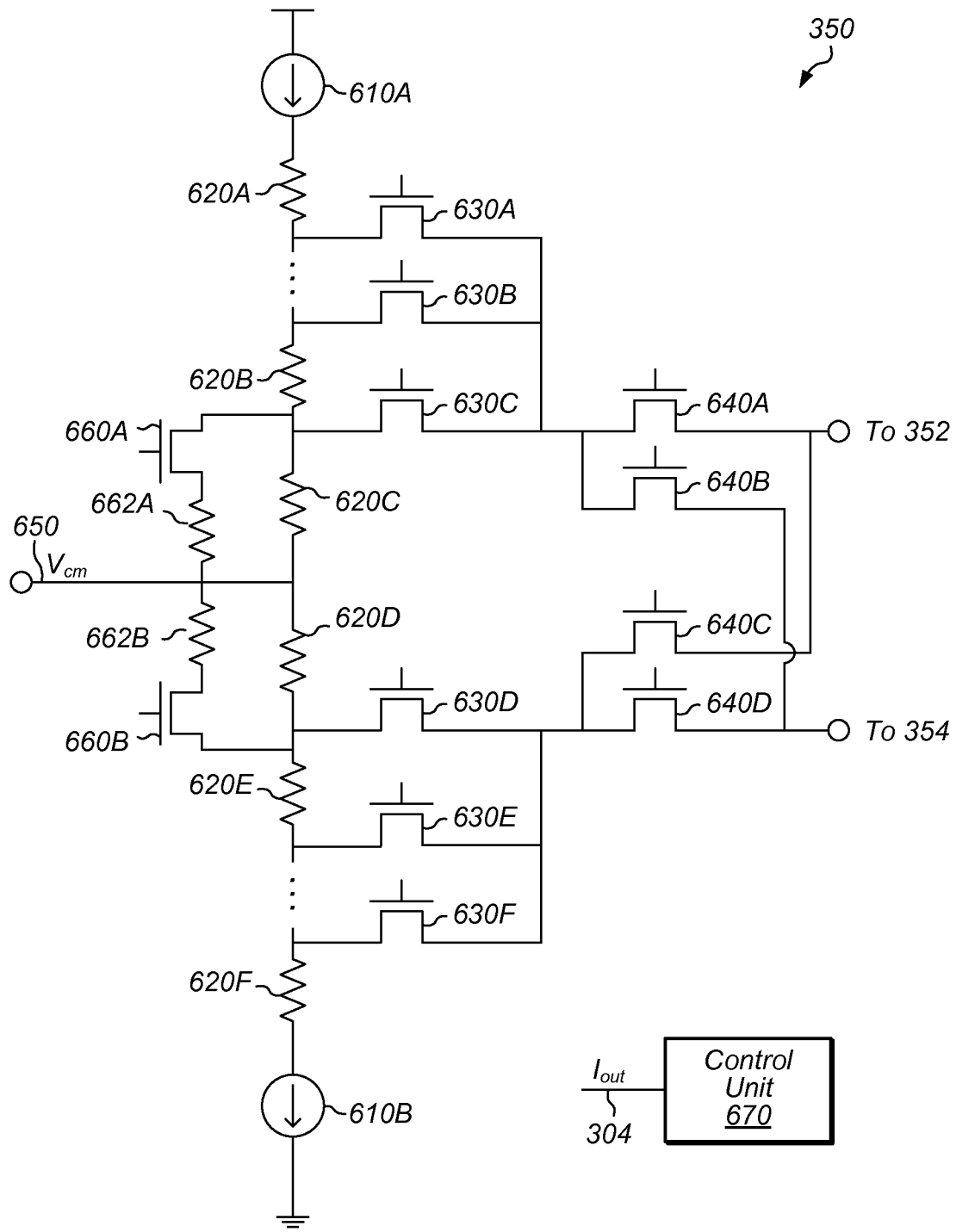
FIG. 6 is a block diagram illustrating one embodiment of a calibration unit configured to apply offset voltages to transistors in a multiplier circuit.

Turning now to FIG. 6, one embodiment of calibration unit 350 is depicted. In the illustrated embodiment, calibration unit 350 includes current sources 610A and 610B, resistors 620A-F (which are coupled together in series and may collectively be referred to herein as a "resistor ladder"), transistors 630A-F, transistors 640AD, and a voltage reference 650, transistors 660A and 660B, and resistors 662A and 662B. Calibration unit 350 also includes a control unit 670 to manage operation of unit 350. In some embodiments, calibration unit 350 may include additional resistors 620 and transistors 630.

As discussed above, in various embodiments, calibration unit 350 is configured to apply offset voltages to the bodies of transistors 320C and 320D. In the illustrated embodiment, calibration unit 350 generates the voltages by passing a current from current source 610A through resistors 620. The voltages are generated around a common-mode voltage $V_{cm}$ received from reference 650. Calibration unit 350 then controls which voltages are selected by switching on or off transistors 630. Calibration unit 350 then routes the selected voltages out to lines 352 and 354 by using transistors 640. For example, calibration unit 350 may select the voltage created by the voltage drop across resistor 620A to by activating transistor 630A. Calibration unit 350 may then route the voltage to line 354 by activating transistor 640B.

In the illustrated embodiment, calibration unit 350 is configured to further control the selection of offset voltages by using transistors 660A and 660B to couple one or both of resistors 662 in parallel with resistors 620C and 620D, respectively. By doing so, calibration unit 350 is able to reduce the voltage drop across resistors 620C and 620D (e.g., by a half when resistors 662 and 620 have the same resistance). Thus, if a particular desired offset voltage falls between a pair of voltages selectable by using transistors 630 (e.g., between 30 mV and 35 mV), calibration unit 350 can couple a resistor 662 to change the voltage so that it falls within the desired range (e.g., 32.5 mV).

In one embodiment, control unit 670 is configured to determine whether offset voltages are needed and to control the selection of offset voltages using transistors 630, 640, and 660. Thus, in some embodiments, control unit 670 may perform (or facilitate performance of) method 500 described above. Accordingly, in some embodiments, control unit 670 is configured to select the appropriate pair of offset voltages based on the difference in the produced currents. In other embodiments, however, control unit 670 may be configured to test multiple pairs of offset voltages until it can determine the best pair based on trial-and-error. In both instances, control unit 670 may need to apply the same pair of offset voltages twice to test both arrangements of the voltages (i.e., the arrangement in which a first voltage and a second voltage are applied respectively to transistors 320C and 320D, and the arrangement in which the second voltage and the first voltage are applied respectively to transistors 320C and 320D).

While calibration unit 350 may be able to correct a non-ideal transfer function of a multiplier 210, a pair of multipliers 210 may still produce different currents relative to one another given the same input. The method described next, in many instances, is able to account for this additional problem.

Figure 7:
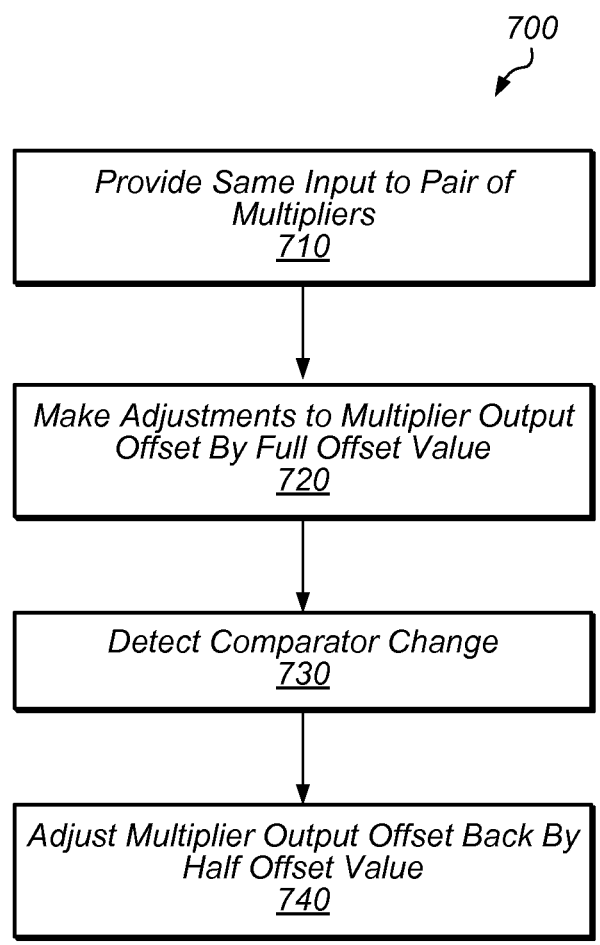
FIG. 7 is a flow diagram illustrating one embodiment of a method for calibrating output offsets for multiplier circuits.

Turning now to FIG. 7, a flow chart of a method 700 for calibrating output offsets for multipliers is depicted. Method 700 is one embodiment of a method that may be performed by a circuit that includes multipliers (such as power detection unit 120) or circuit coupled to a multiplier such as output offset unit 250. Like method 500, method 700, in some embodiments, may be performed as part of an initial calibration for the circuit (such as during the circuit's startup, during testing of the circuit by automated testing equipment (ATE), etc.).

In step 710, the same input is provided to a pair of multipliers (e.g., multipliers 210) coupled to a comparator (e.g., comparator 240). As discussed above, in some embodiments, this signal may be a voltage differential signal, and the multipliers may produce currents that vary proportional to the square of the input signal (e.g., $I_{in}$ 212 and $I_{REF}$ 214, described above).

In step 720, adjustments are made to the output offset for one of the multipliers (e.g., multiplier 210B; in other embodiments, adjustments to output offsets for both multipliers may be made) by a full offset value and starting from an initial value. As will be described below in conjunction with FIG. 8, in various embodiments, output offset unit 250 may be configured to produce a range of voltages for converter 230B. Unit 250 may start at the lower part of the range and begin increasing the voltages by a particular amount (i.e., a "full offset value") causing converter 230 to produce a voltage with an increasing DC offset. For example, unit 250 may cause converter 230B to increase the DC offset of produced voltages by 1 mV increments until reaching step 730.

In step 730, a change in the output of the comparator is detected. Since the multipliers are being provided the same input in step 710, this change in the output at the comparator indicates that the inputs of the comparator are now similar. For example, if the output of converter 230A is 99.5 mV for the given input and the output of converter 230B is 99 mV, an adjustment in step 720, which causes converter 230B to produce 100 mV, will produce a change in the output of comparator 240—thus, indicating that the inputs are similar.

In step 740, the multiplier output offset is adjusted back by half an offset value after the change in step 730 is detected. For example, if adjustments of 1mV are being made in step 720 and the output of converter 230B changes from 99 mV to 100 mV, an adjustment back to 99.5 mV would be made in the illustrated embodiment since 0.5 mV is half of 1 mV. In this way, step 740 is able to better compensate for an over adjustment in step 720. In other words, adjusting the output of converter 230B back to 99.5 mV is closer to the 99.5 mV output by converter 230A than the initial 100 mV output at the end of step 720.

As will be described below, in various embodiments, output offset unit 250 is configured to produce voltages for converter 230B by passing a current through a resistor ladder and selecting various ones of the resistors (such as described with calibration unit 350). In some embodiments, output offset unit 250 is also configured to change the generated voltage of a selected resistor by coupling a resistor in parallel with one of the resistors in the resistor ladder.

Figure 8:
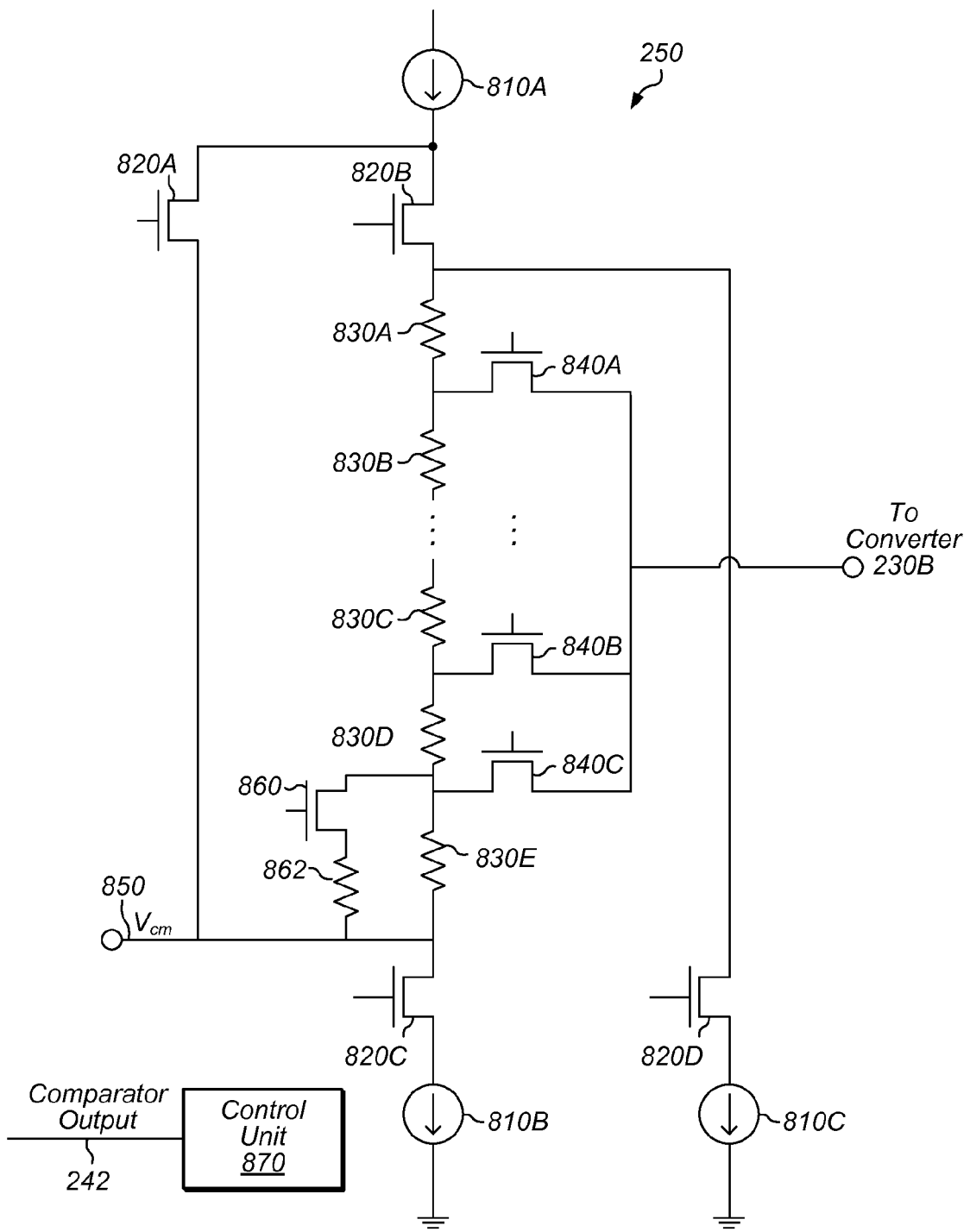
FIG. 8 is a block diagram illustrating one embodiment of an offset output unit configured to apply an output offset to a multiplier circuit.

Turning now to FIG. 8, one embodiment of output offset unit 250 is depicted. In the illustrated embodiment, output offset unit 250 includes current sources 810A-C, transistors 820A-D, resistors 830A-E, transistors 840A-C, voltage reference 850, transistor 860, and resistor 862. Output offset unit 250 also includes a control unit 870 to manage operation of unit 250. In some embodiments, output offset unit 250 may include additional resistors 830 and transistors 840.

In the illustrated embodiment, output offset unit 250 generates the offset voltages by passing a current from current source 810A through resistors 830. The voltages are generated around a common-mode voltage $V_{cm}$ received from reference 850. Output offset unit 250 then controls which voltages are selected and provided to converter 230B by activating transistors 840. To reduce the number of resistors 830 (which can be substantially large, in some embodiments), output offset unit 250, in the illustrated embodiment, is configured to use transistors 820 to change the direction of the current flowing through resistors 830. In this way, output offset unit 250 is able to produce voltages lower than $V_{cm}$ by causing the current generated by source 810A to flow from node 850 to current source 810C, instead of through resistors 830 to current source 810B. In other embodiments in which unit 250 does not include transistors 820, however, unit 250 may include additional resistors after node 850 to produce voltages lower than $V_{cm}$.

In the illustrated embodiment, output offset unit 250 is also configured to couple resistor 862 in parallel with resistor 830E to reduce the voltage drop across resistors 830E (e.g., by a half when resistors 862 and 820E have the same resistance). Thus, if a particular desired voltage falls between a pair of voltages selectable by using transistors 830 (e.g., between 99 mV and 100 mV such as described above), output offset unit 250 can couple resistor 862 to change the voltage so that it falls within the desired range (e.g., 99.5 mV).

In various embodiments, control unit 870 is configured to determine which output offset to apply and control transistors 820, 840, and 860, accordingly. As discussed above in conjunction with method 700, in one embodiment, control unit 870 is configured to determine the output offset based on when output 242 of comparator 240 changes.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A power detection unit, comprising:
a first multiplier circuit configured to receive a first voltage of a voltage differential signal at gates of a first transistor pair and a second voltage of the voltage differential signal at gates of a second transistor pair, wherein the first multiplier circuit is configured to output a current that varies proportionally to a square of a voltage difference between the first and second voltages;
wherein sources of the first transistor pair are coupled to sources of the second transistor pair;
wherein the sources of the second transistor pair are coupled together.

2. The power detection unit of claim 1, wherein the power detection unit is configured to provide a power indication for the voltage differential signal, and wherein an automatic gain control (AGC) system is configured to control a gain of an amplifier based on the power indication.

3. The power detection unit of claim 1, wherein the first multiplier circuit is configured to output the current from a line coupled to a drain of a transistor in the first transistor pair and a drain of a transistor in the second transistor pair, and wherein a drain of another transistor in the first transistor pair and a drain of another transistor in the second transistor pair are coupled to a ground reference.

4. The power detection unit of claim 1, wherein the power detection unit is configured to apply offset voltages to bodies of transistors in the first and second transistor pairs in response to determining that the first multiplier circuit has a non-ideal transfer function.

5. The power detection unit of claim 4, wherein the power detection unit is configured to generate the offset voltages by passing a current through a resistor ladder that includes a plurality of resistors coupled together in series, and wherein the power detection unit is configured to change a generated offset voltage by coupling a resistor in parallel with one of the plurality of resistors coupled together in series.

6. The power detection unit of claim 1, further comprising:
a second multiplier circuit configured to output a reference current; and
a comparison unit configured to compare the reference current output by the second multiplier circuit with the current output by the first multiplier circuit.

7. The power detection unit of claim 6, wherein the power detection unit is configured to perform a calibration of the first and second multiplier circuits that includes determining whether the currents output by the first and second multiplier circuits differ in response to receiving the same input voltages.

8. A power detection unit, comprising:
a first multiplier circuit configured to receive a first voltage of a voltage differential signal at gates of a first transistor pair and a second voltage of the voltage differential signal at gates of a second transistor pair, wherein the first multiplier circuit is configured to output a current that varies proportionally to a square of a voltage difference between the first and second voltages;
wherein the power detection unit is configured to adjust a threshold voltage of a transistor in the first transistor pair and a threshold voltage of a transistor in the second transistor pair.

9. The power detection unit of claim 8, wherein the power detection unit is configured to adjust the threshold voltages by applying offset voltages to a body of the transistor in the first transistor pair and a body of the transistor in the second transistor pair in response to determining that the first multiplier circuit has a non-ideal transfer function.

10. The power detection unit of claim 9, wherein the power detection unit is configured to change one of the applied offset voltages by a first amount, by selecting one or more of a plurality of resistors coupled together in series, and wherein power detection unit is configured to change the one applied offset voltage by a second amount, by coupling a resistor in parallel with one of the plurality of resistors coupled together in series.

11. The power detection unit of claim 8, wherein the power detection unit is configured to measure the output current by using an analog-to-digital converter (ADC), and wherein the power detection unit is configured to determine whether the first multiplier circuit has a non-ideal transfer function based on the measured output current.

12. The power detection unit of claim 8, wherein sources of the first transistor pair and sources in the second transistor pair are coupled together via a common line.

13. The power detection unit of claim 8, further comprising:
a second multiplier circuit configured to output a reference current; and
a comparison unit configured to compare the reference current output by the second multiplier circuit with the current output by the first multiplier circuit, and to provide a corresponding comparison indication;
wherein the power detection unit is configured to perform a calibration of the first and second multiplier circuits that includes adjusting an output offset of the second multiplier circuit by a first value until the comparison indication changes and adjusting the output offset by a second value after the comparison indication changes.

14. The power detection unit of claim 13, wherein the second value is different than the first value.

15. A method, comprising:
providing positive and negative voltage differential signals to gates of first and second transistor pairs in a multiplier circuit, wherein the multiplier circuit is configured to output a current that varies proportionally to a square of a voltage difference between the gates of the first transistor pair and the gates of the second transistor pair;

determining whether the multiplier circuit produces the same current in response to the positive and negative voltage differential signals;

applying offset voltages to a body of a transistor in the first transistor pair and a body of a transistor in the second transistor pair based on the determining.

16. The method of claim 15, wherein the multiplier circuit is one of a plurality of multiplier circuits included within an automatic gain control (AGC) system performing the method.

17. The method of claim 15, wherein the determining includes measuring a difference between a current produced in response to the positive voltage differential signal and a current produced in response to the negative voltage differential signal, and wherein the applying includes selecting a pair of offset voltages to be applied based on the measured difference.

18. The method of claim 15, further comprising:

providing a voltage differential signal to the multiplier circuit and another multiplier circuit to cause the multiplier circuits to produce respective currents;

comparing the currents produced by the multiplier circuits; and applying an output offset to one of the multipliers based on the comparing.

19. The method of claim 18, wherein applying the output offset includes changing a voltage provided to a current-to-voltage converter coupled to the one multiplier.

20. The method of claim 19, wherein the voltage provided to the current-to-voltage converter is generated by passing a current through a resistor ladder in a direction, and wherein the voltage provided to the current-to-voltage converter is changed by changing the direction of the current passing through the resistor ladder.

\* \* \* \* \*